US009324724B1

(12) United States Patent
Liu et al.

(10) Patent No.: US 9,324,724 B1
(45) Date of Patent: Apr. 26, 2016

(54) METHOD OF FABRICATING A MEMORY STRUCTURE

(71) Applicant: UNITED MICROELECTRONICS CORPORATION, Hsinchu (TW)

(72) Inventors: Weichang Liu, Singapore (SG); Zhen Chen, Singapore (SG); Shen-De Wang, Zhudong Township (TW); Wei Ta, Singapore (SG); Wang Xiang, Singapore (SG); Yi-Shan Chiu, Zhongli (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/859,358

(22) Filed: Sep. 21, 2015

(51) Int. Cl.
| | |
|---|---|
| *H01L 21/3205* | (2006.01) |
| *H01L 27/115* | (2006.01) |
| *H01L 29/66* | (2006.01) |
| *H01L 21/28* | (2006.01) |
| *H01L 21/3213* | (2006.01) |
| *H01L 21/3105* | (2006.01) |
| *H01L 29/423* | (2006.01) |
| *H01L 29/51* | (2006.01) |
| *H01L 29/49* | (2006.01) |
| *H01L 21/311* | (2006.01) |

(52) U.S. Cl.
CPC .... *H01L 27/11568* (2013.01); *H01L 21/28282* (2013.01); *H01L 21/3105* (2013.01); *H01L 21/31116* (2013.01); *H01L 21/32133* (2013.01); *H01L 29/42328* (2013.01); *H01L 29/4916* (2013.01); *H01L 29/518* (2013.01); *H01L 29/66553* (2013.01); *H01L 29/66833* (2013.01)

(58) Field of Classification Search
CPC ............... H01L 27/11568; H01L 21/28282; H01L 21/3105; H01L 21/31116; H01L 21/32133; H01L 29/42328; H01L 29/4916; H01L 29/518; H01L 29/66553; H01L 29/66833

USPC ............. 438/585, 594, 595, 275, 303
See application file for complete search history.

(56) References Cited

U.S. PATENT DOCUMENTS

| | | | | |
|---|---|---|---|---|
| 2002/0063283 | A1 | 5/2002 | Pan | |
| 2008/0074927 | A1* | 3/2008 | Hofmann | G11C 16/0483 365/185.17 |
| 2008/0290401 | A1* | 11/2008 | Yasui | G11C 16/0425 257/324 |
| 2015/0102400 | A1* | 4/2015 | Chen | H01L 29/792 257/325 |
| 2015/0380568 | A1* | 12/2015 | Tseng | H01L 29/792 257/326 |

OTHER PUBLICATIONS

U.S. Appl. No. 14/569,794, filed Dec. 15, 2014, First Inventor Name : Liu Weichang.
U.S. Appl. No. 14/521,893, filed Oct. 23, 2014, First Inventor Name : Chu-Fu Lin.

* cited by examiner

*Primary Examiner* — Kevin M Picardat
(74) *Attorney, Agent, or Firm* — Ding Yu Tan

(57) ABSTRACT

The present invention provides a method of fabricating a memory structure, especially forming an oxide on top of a spacer to prevent the spacer from being over-etched, the method comprising the steps of: providing a semiconductor substrate; forming a charge trapping layer, a first conducting layer and a capping layer as a gate stack on the substrate; forming a first gate structure by patterning; a plurality of spacers are patterned and disposed adjacent to the sidewall of said gate stack; depositing a second conducting layer on the substrate to cover the first gate structure and the spacer; selectively etching the second conducting layer to expose the top of the spacer; performing an oxidation process to form an oxide on top of the spacer.

11 Claims, 9 Drawing Sheets

METHOD OF FABRICATING A MEMORY STRUCTURE

FIELD OF THE INVENTION

The present invention generally relates to a flash memory, and more particularly a flash memory having a oxide-nitride (ON) spacer, to form an oxidation layer on top of the oxide-nitride (ON) spacer for preventing etch damage and method of manufacturing the same.

BACKGROUND OF THE INVENTION

A non-volatile memory, such as Flash memory, retains stored data even if power to the memory is removed. A non-volatile memory cell stores data, for example, by storing, electrical charge in an electrically isolated memory gate or in a charge-trapping layer underlying a control gate of a field-effect transistor (FET). The stored electrical charge controls the threshold of the FET, thereby controlling the memory state of the cell.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

In the manufacture of the split-gate memory cell, the oxide-nitride (ON) spacer isolating between the memory gate and select gate may be easily and seriously damaged by common etching processes. This damage issue may influence the breakdown voltage between the memory gate and the select gate, which in turn impacts the overall electrical performance. Accordingly, there is a need for a memory device and methods for preventing the ON spacer damage in the manufacturing process thereof in order to maintain the performance and reliability of the memory device.

In an actual case, refer to FIG. 9, during the common etching process, the oxide-nitride (ON) spacer isolating between the memory gate and the select gate is apt to be damaged by phosphoric acid ($H_3PO_4$) solvent, especially during silicon nitride (SiN) removal process, It will cause a high leakage current between the memory gate and the select gate and lower the breakdown voltage between the memory gate and the select gate, thereby impact the performance and reliability of the memory device.

Currently, in view of preventing the over etching upon the spacer, a method of fabricating a memory structure by forming an oxide on top of a SiN spacer is provided.

There is a need for a memory device and methods for preventing the ON spacer damage in the manufacturing process thereof in order to maintain the performance and reliability of the memory device.

SUMMARY OF THE INVENTION

The present invention provides a method of fabricating a flash memory structure, especially forming an oxidation layer on the top of oxide-nitride (ON) spacer for preventing etch damage.

For reaching the above purpose and other technical advantages, the present invention provides a method comprising the steps of: providing a semiconductor substrate; forming a charge trapping layer, a first conducting layer and a capping layer as a memory gate structure on the substrate; forming an oxide-nitride spacer on the side of the memory gate structure; depositing a second conducting layer on the substrate to cover the memory gate structure and the spacer; selectively etching the second conducting layer to expose the top of the spacer; performing an oxidation process to form an oxidation layer on the top of the oxide-nitride spacer.

As described above, the present invention performing an oxidation process to form an oxidation layer on the top of the oxide-nitride spacer, for preventing from being damaged during the etching process, and meanwhile prevent the device from occurring lower breakdown voltage.

DETAILED DESCRIPTION OF PREFERRED EMBODIMENTS

Figure 1:
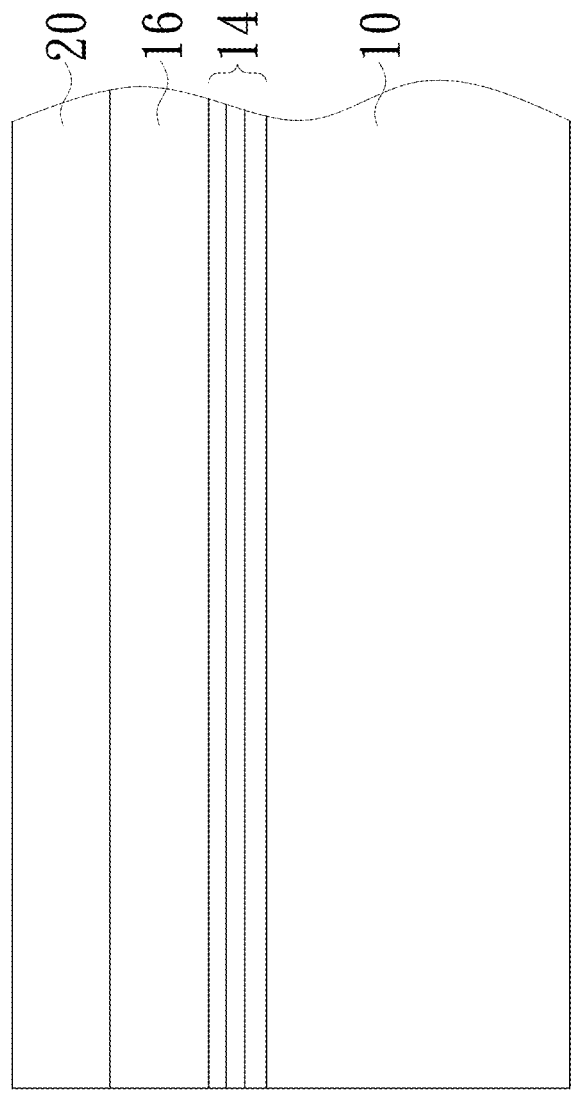
FIGS. 1~8 are cross-sectional views for illustrating a fabrication process of a memory structure according to an embodiment of the present invention.

Referring to FIG. 1, a microcircuit element such as a memory cell or memory structure is to be fabricated having a charge trapping layer 14, a first conducting layer 16 and a capping layer 20 formed on a semiconductor substrate 10. The charge trapping layer 14 is an oxide/nitride/oxide tri-layer stack collectively and commonly referred to as "ONO" structure, which commonly serves as a charge trapping dielectric by including a charge trapping silicon nitride layer sandwiched between two silicon dioxide layers. A first conducting layer 16 is formed on the charge trapping layer 14. Any appropriate gate conductor material could be used to form the first conducting layer 16 such as polysilicon, according to a preferred embodiment.

A capping layer 20 is disposed over the first conducting layer 16. The capping layer 20 may comprise any suitable material that allows for selective removal (e.g., etching) of the unmasked portion of the first conducting layer 16. According to the preferred embodiment, the capping layer 20 is a silicon nitride (SiN) layer or a silicon carbon nitride (SiCN) layer.

Figure 2:
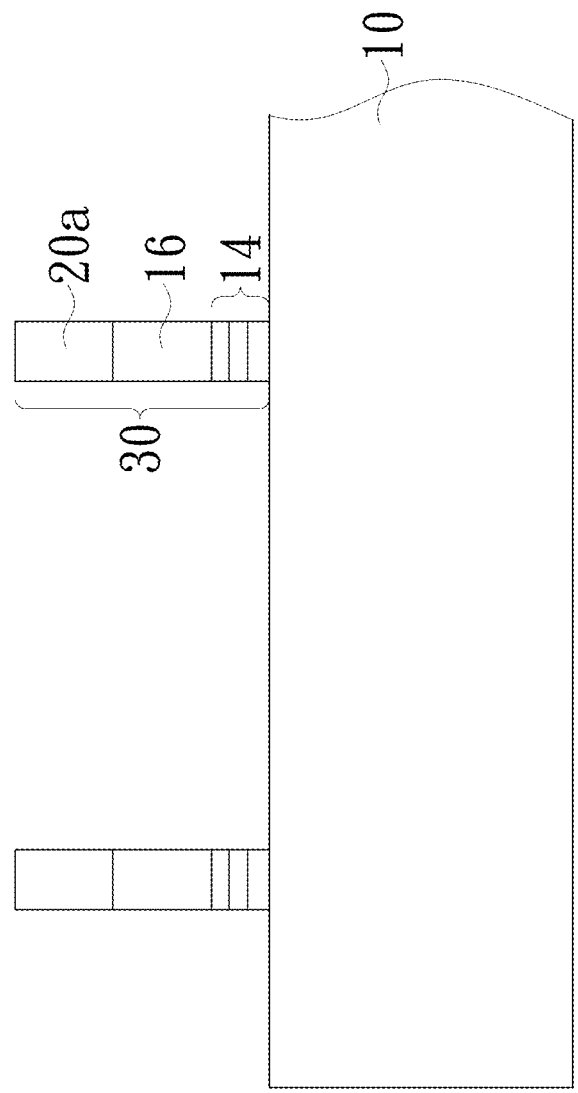

Referring still to FIG. 1, the capping layer 20, the first conducting layer 16 and the charge trapping layer 14 are patterned to create a gate structure 30. This patterning process may comprise several conventional steps. For example, referring to FIG. 2, the capping layer 20 may be first patterned into a hard mask 20a with gate patterns using photoresist. An etching process is then performed with the hard mask 20a to pattern the first conducting layer 16 and the charge trapping layer 14 into a memory gate structure 30.

Figure 3:
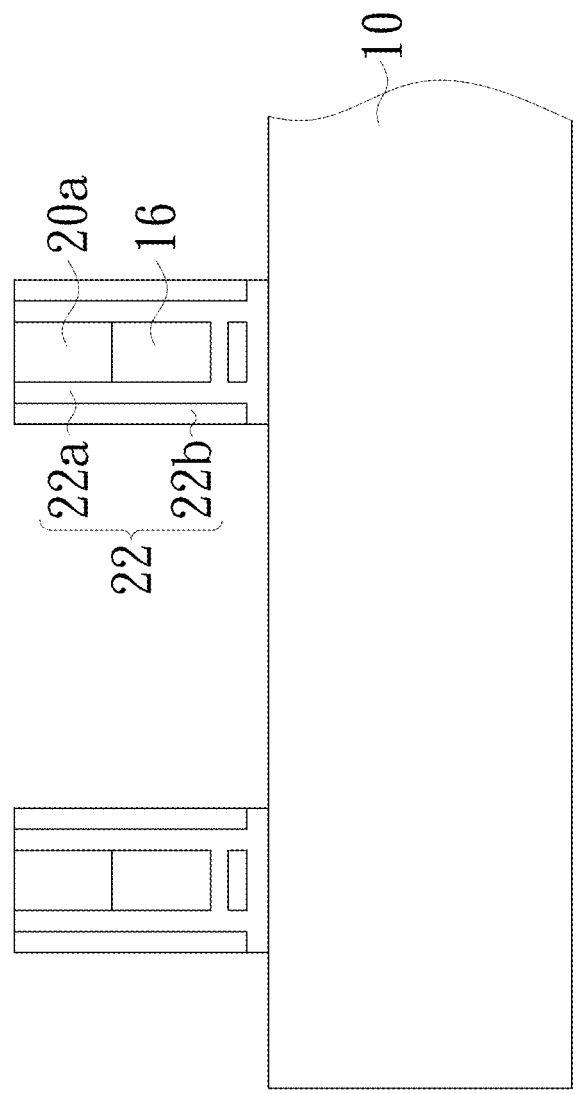

Referring to FIG. 3, a spacer 22 is formed on the sides of the gate structure 30. According to the preferred embodiment, the spacer 22 comprises one or more layers of dielectric such as oxide-nitride (ON), which is referred to as an ON spacer. The formation of the ON spacer 22 may comprise several conventional steps. For example, an oxide layer 22a and a nitride layer 22b may be formed sequentially and conformally adjacent to the memory gate structure 30 and on the substrate 10 by well-known deposition method. The deposited, conformal oxide layer and nitride layer are then subjected to an etching process. The etching process would remove the portion of the oxide layer and the nitride layer formed on the plane (at above the top surface of the hard mask 20a), thus only the portion of the oxide layer and the nitride layer formed on the sidewall of the gate structure 30 is left/remained and forms a spacer structure. Preferably, the material of the nitride layer 22b is the same as the nitride hard mask 20a, such as silicon nitride (SiN) or silicon carbide nitride (SiCN), so that the two nitride portions (nitride layer 22b and nitride hard mask 20a, respectively) can be selectively etched or removed in the same process.

Figure 4:
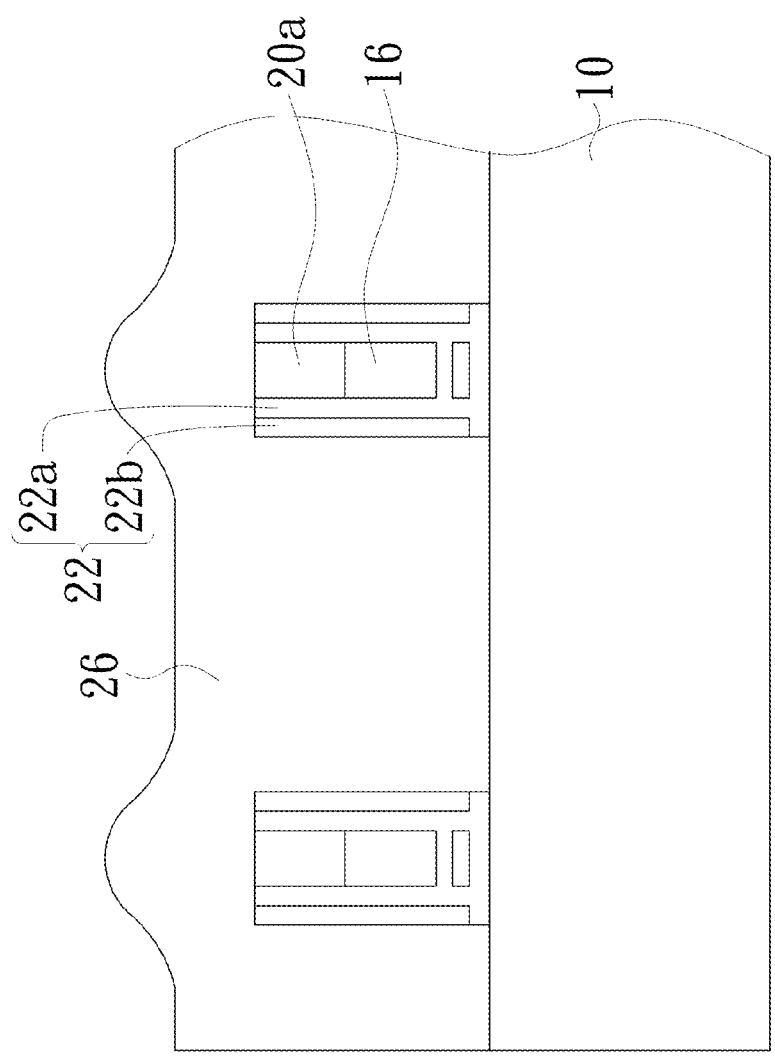
Figure 5:
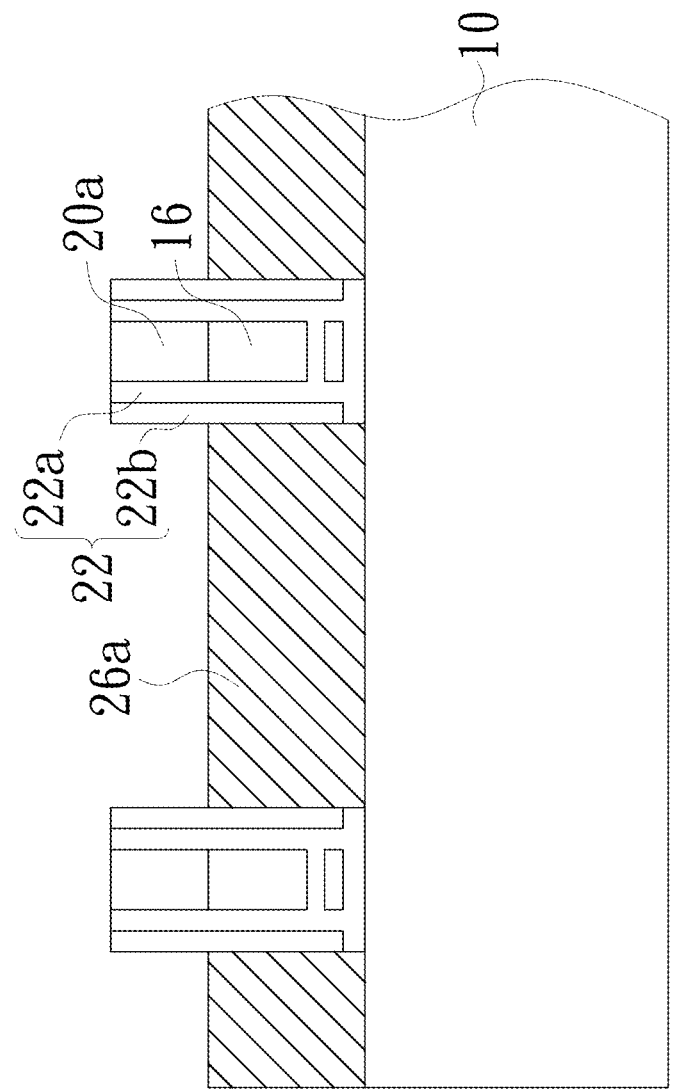

Refer now refer to FIG. 4. After forming the ON spacer 22, a second conducting layer 26 is blanket-covered on the memory gate structure 30 and the substrate 10. The second conducting layer 26 may be formed of any suitable conductor, such as polysilicon. Refer to FIG. 5, after forming the second conducting layer 26, a blanket etching-back process is performed to thin (down) the thickness of the second conducting layer. According to the embodiment, the second conducting layer would be thinned to the extent that the underlying memory gate structure 30 can be formed.

A key feature of the above-identified thinning process of the second conducting layer 26a in the present invention is that it can expose a portion of the nitride layer 22b of the ON spacer 22 above the memory gate structure 30. Moreover, the thinning process can thin the thickness of the exposed nitride layer 22b of the ON spacer 22 at the same time.

Figure 6:
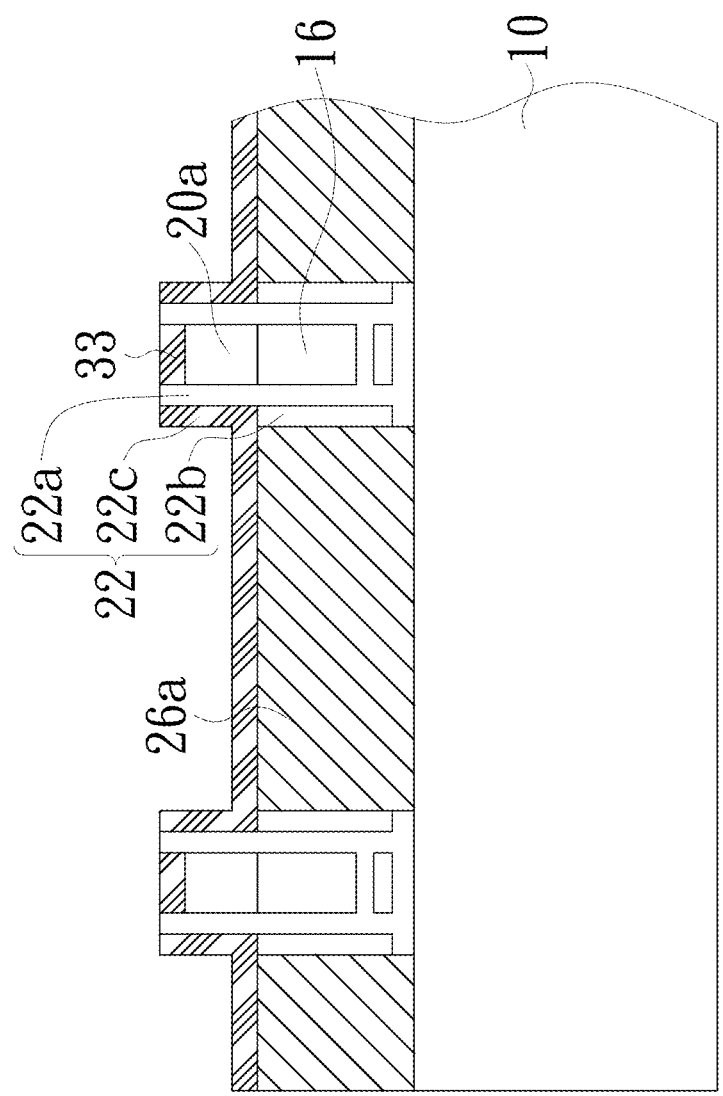

Referring to FIG. 6, it shows a step of performing an oxidation process to form an oxidation layer 33 on the memory device, generally by means of a thermal oxidation process. The thermal oxidation process is usually performed at a temperature between 800° C. and 1200° C. in oxygen containing environment. The oxidation layer 33 is formed by the oxidation process to cover the exposed surface of the second conducting layer 26a, the spacer 22, and the capping layer 20a. In the present invention, the thermal oxidation process is more preferable to use rapid thermal anneal (RTA) process. The rapid thermal anneal refers to a semiconductor manufacturing process which heats silicon wafers to high temperatures (900~1100° C.) on a timescale of several seconds.

Figure 7:
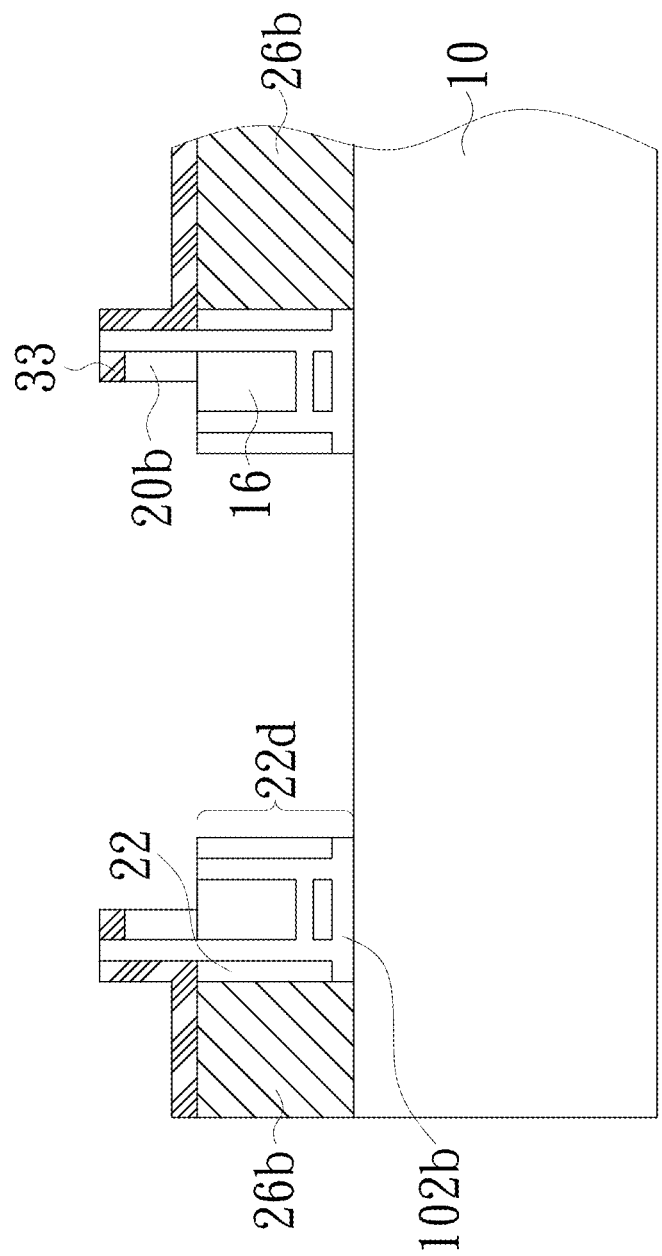

Referring to FIG. 7, a select gate 26b formed by the removal of portions of the gate conductor layer by using a photoresist (not shown) with gate pattern to pattern the nitride hard mask layer 20b, performing a dry etch process using patterned hard mask and with photoresist covering on other regions to pattern the underlying second conducting layer 26 (e.g. to be a select gate 26b). Redundant description of similar steps is herein omitted by simplicity and clarity. The select gate 26b is subsequently formed on one side of the ON spacer 22, wherein the ON spacer 22 interfaces between the memory gate 30 and the select gate 26b.

Figure 8:
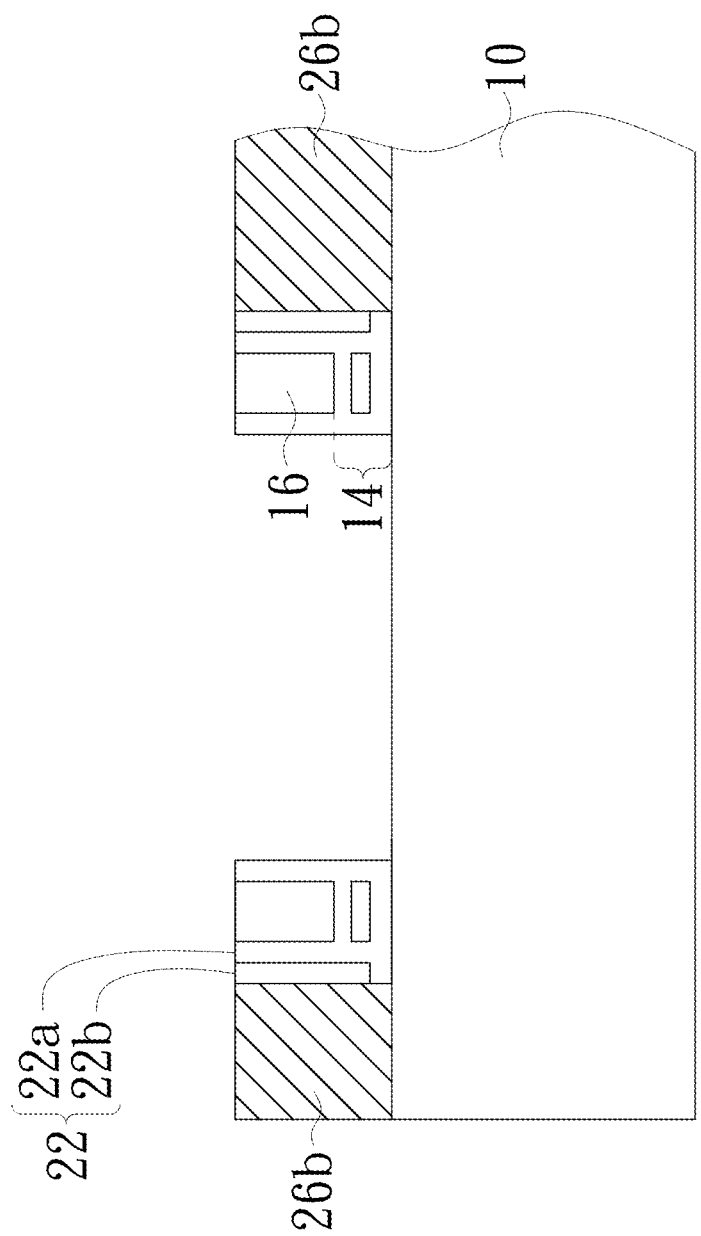
Figure 9:
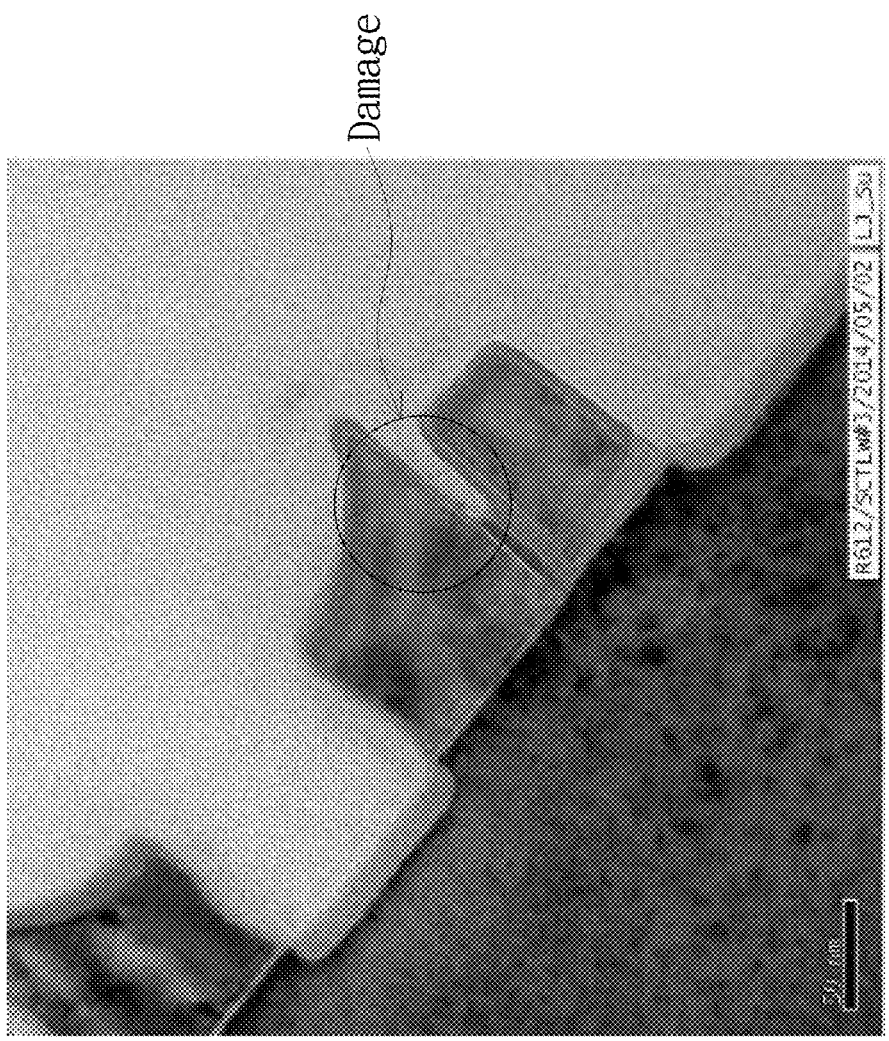
FIG. 9 is photograph for illustrating the ON spacer that has been seriously damaged after SiN removal process by $H_3PO_4$ solvent.

Referring to FIG. 8, after forming the select gate 26b, the remaining nitride hard mask 20b will be removed by a wet etching process using phosphoric acid ($H_3PO_4$) to expose the underlying memory gate structure 30. This removing process reflects the critical feature and function of the oxidation layer 33. As shown in FIG. 7, the oxidation layer 33 would prevent the ON spacer from damage by the etchant in the wet etching process for removing the nitride hard mask, thereby significantly mitigating the etch damage of the upper nitride portion of the ON spacer 22. The electrical performance and the reliability of the finally fabricated memory device are therefore well-maintained or sustained.

An optional wet etching process using diluted hydrofluoric acid (DHF) may be performed to remove the oxidation layer 33 above the memory gate or clean the substrate.

According to the above-mentioned embodiment shown in FIGS. 1-8, a flash memory structure is also provided in the present invention, wherein the flash memory structure includes a memory gate structure 30 on a substrate 10, a select gate 26b adjacent to the memory gate structure 30, an oxide-nitride spacer 22 interfaces between the memory gate 30 and the select gate 26b, wherein the oxide-nitride spacer 22 further includes an oxide layer and a nitride layer.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A method of fabricating a memory structure, comprising the steps of:
   providing a semiconductor substrate;
   forming a memory gate structure with a charge trapping layer, a first conducting layer and a hard mask on said semiconductor substrate;
   forming an oxide-nitride spacer on the side of said memory gate structure;
   depositing a second conducting layer on said substrate to cover said memory gate structure and said oxide-nitride spacer;
   etching back said second conducting layer to expose said hard mask on said memory gate structure and a top portion of said oxide-nitride spacer;
   performing an oxidation process to form an oxidation layer on top of said oxide-nitride spacer; and
   forming a select gate on one side of said oxide-nitride spacer.

2. The method as claimed in claim 1, wherein said oxide-nitride (ON) spacer includes an oxide layer.

3. The method as claimed in claim 1, wherein said oxide-nitride (ON) spacer includes an nitride layer.

4. The method as claimed in claim 3, wherein said nitride layer of said ON spacer comprises silicon nitride (SiN) or silicon carbide nitride (SiCN).

5. The method as claimed in claim 1, wherein further performing a second etch to form a select gate.

6. The method as claimed in claim 1, wherein said charge trapping layer comprises an oxide-nitride-oxide (ONO) structure.

7. The method as claimed in claim 1, wherein said etching back comprises using a first photoresist pattern as an etch mask.

8. The method as claimed in claim 1, wherein said memory gate structure and said select gate comprise polysilicon.

9. The method as claimed in claim 1, further comprising removing said hard mask after forming said select gate.

10. The method as claimed in claim 1, wherein the oxidation process comprises a rapid thermal anneal (RTA).

11. The method as claimed in claim 1, wherein said nitride hard mask is removed by wet etching process using phosphoric acid.

* * * * *